(12) United States Patent
Choi et al.

(10) Patent No.: US 6,245,482 B1
(45) Date of Patent: *Jun. 12, 2001

(54) POLYMER AND CHEMICALLY AMPLIFIED RESIST COMPOSITION INCLUDING SILICON CONTAINING PROTECTING GROUP

(75) Inventors: Sang-jun Choi, Seoul; Joo-tae Moon, Kyungki-do, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/511,314

(22) Filed: Feb. 23, 2000

Related U.S. Application Data

(63) Continuation of application No. 09/251,159, filed on Feb. 17, 1999, now Pat. No. 6,051,362.

(30) Foreign Application Priority Data

May 7, 1998 (KR) ................................................ 98-16297

(51) Int. Cl.⁷ ...................................................... G03C 1/72
(52) U.S. Cl. ...................... 430/270.1; 430/905; 430/910; 526/279; 526/313
(58) Field of Search ................... 430/270.1, 905, 430/910; 526/279, 313

(56) References Cited

U.S. PATENT DOCUMENTS

| 4,491,628 | 1/1985 | Ito et al. | |
| 5,981,141 | * 11/1999 | Choi et al. | 430/270.1 |
| 6,045,970 | * 4/2000 | Choi et al. | 430/270.1 |

OTHER PUBLICATIONS

Akiko Kotachi et al., "Si–Containing Positive Resist for ArF Excimer Laser Lithography" Photopolym Sci. Technol., vol. 8, No. 4, 1995, pp. 615–622.

* cited by examiner

Primary Examiner—Hoa Van Le
Assistant Examiner—Yvette M. Clarke
(74) Attorney, Agent, or Firm—Jones Volentine, L.L.C.

(57) ABSTRACT

There is provided a polymer for use in a chemically amplified resist and represented by the following formula:

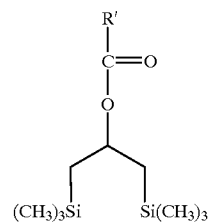

where R' is one selected from the group consisting of:

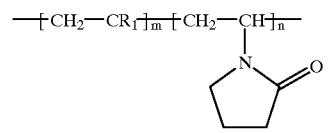

in which $R_1$ is one selected from the group consisting of —H and —$CH_3$, and m and n are integers, and

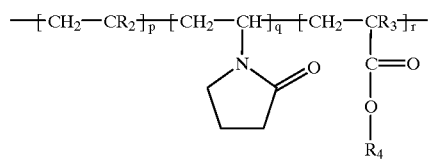

where $R_2$ is one selected from the group consisting of —H and —$CH_3$, $R_3$ is one selected from the group consisting of —H and —$CH_3$, $R_4$ is one selected from the group consisting of —H, —$CH_3$ and —$CH_2CH_2OH$, p, q and r are integers, $p/(p+q+r)$ is 0.1~0.7, $q/(p+q+r)$ is 0.1~0.7, and $r/(p+q+r)$ is 0.1~0.5.

6 Claims, No Drawings

POLYMER AND CHEMICALLY AMPLIFIED RESIST COMPOSITION INCLUDING SILICON CONTAINING PROTECTING GROUP

CROSS REFERENCE TO RELATED APPLICATIONS

This is a continuation application of application Ser. No. 09/251,159, filed Feb. 17, 1999, now U.S. Pat. No. 6,051,362 which is hereby incorporated by reference in its entirety for all purposes.

BACKGROUND OF THE INVENTION

1. Field of the Invention

The present invention relates to a chemically amplified photoresist composition, and more particularly, to a chemically amplified photoresist composition composed of a silicon-containing polymer compound.

2. Description of the Related Art

As semiconductor devices become highly integrated and complicated to manufacture, fine pattern formation is required. Accordingly, there is a great demand for new photoresists to be used in photolithography. Further, as the capacity of a semiconductor memory device exceeds 1 Gbit, a new photoresist material capable of being developed into a sharp pattern after exposure by an ArF excimer laser (193 nm) is necessary.

A photoresist that is intended for use with an ArF laser may be either a single layer resist (SLR) or a bi-layer resist (BLR), depending on the semiconductor fabrication process. Generally, the photoresist patterning process is simpler using an SLR than using a BLR. However, there are many problems associated with using an SLR. Foremost among them is the low dry etch resistance of the SLR. Another problem with SLR is the collapse of patterns having a high aspect ratio.

Although the patterning process is more complicated when a BLR is used, the BLR has a significantly higher dry etching resistance than the SLR due to the presence of silicon in the photoresist. During dry etching by $O_2$ plasma, the silicon atoms in the BLR material crystallize into glass to form a hard layer over the surface of the photoresist layer. This hard layer acts as an etching mask during subsequent dry etching, thereby permitting the formation of a sharp pattern even if the aspect ratio is high.

The content of silicon in a polymer that is to be used in a photoresist composition is an important factor in fabricating the BLR. One example of a silicon containing polymer used in a bi-layer photoresist intended for use in an ArF excimer laser lithography process, is disclosed in Akiko Kotachi et al., "Si-containing Positive Resist for ArF Excimer Laser Lithography", J. Photopolymer Science and Technology, Vol. 8, No. 4, p 615, 1995. However, the silicon content in the polymer disclosed in the above reference, poly (TMSMMA-RMA), is only about 8 wt %. It is recognized that a silicon content of at least 10 wt % is necessary to attain a high enough aspect ratio, therefore the conventional silicon-containing polymers are not adequate to provide the high dry etching resistance that is required to form a sharp photoresist pattern at the high aspect ratio. Further, the silicon polymer described in Kotachi et al. for use with an ArF excimer laser in photolithography has inadequate adhesion characteristics, which means that the resist layer formed using the polymer may lift from the underlying layer, thus forming a photoresist pattern that is not sharp enough.

SUMMARY OF THE INVENTION

To solve the above problems, it is an objective of the present invention to provide polymers having a new structure and containing enough silicon to be useful in ArF excimer laser photolithography. It is another objective of the present invention to provide a chemically amplified photoresist composition containing the polymer.

Accordingly, to achieve the first objective, the present invention provides a polymer for use in a chemically amplified photoresist that is represented by the following chemical formula (CF1):

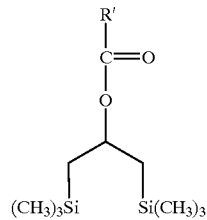

wherein R' is one selected from the group comprising:

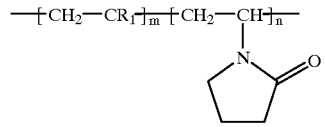

in which $R_1$ is one selected from the group comprising —H and —$CH_3$; m and n are integers; m/(m+n)= 0.1–0.6; and

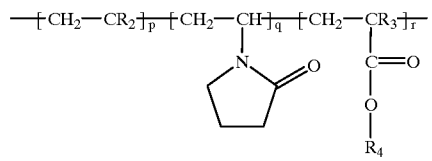

wherein $R_2$ is one selected from the group comprising —H and —$CH_3$; $R_3$ is one selected from the group comprising —H and —$CH_3$; $R_4$ is one selected from the group comprising —H; —$CH_3$ and —$CH_2CH_2OH$; p, q and r are integers; p/(p+q+r)= 0.1 to 0.7; q/(p+q+r)=0.1 to 0.7; and r/(p+q+r)=0.1 to 0.5.

To achieve the second objective, the present invention provides a photoresist composition having the polymer represented by CF1, and a photoacid generator (PAG).

The polymer has a weight-average molecular weight of from 5,000 to 100,000.

The photoresist composition comprises from 1 to 15 weight percent of the PAG based on the weight of the polymer.

The PAG is selected from the group comprising triarylsulfonium salts, diaryliodonium salts, sulfonates and any combination thereof.

The photoresist composition further comprises an organic base which is present in an amount of from 0.01 to 2.0 weight percent of the polymer; the organic base is one selected from the group comprising triethyl amine, diethyl amine, triethanol amine, and any combination thereof.

The present invention also provides a polymer that has a silicon-containing acid-labile group, and a photoresist composition containing the polymer. The polymer according to the present invention, therefore, has a greater content of silicon than conventional polymers, and it has excellent adhesion to other films.

DESCRIPTION OF THE PREFERRED EMBODIMENTS

The preferred embodiments of the present invention will now be described. In general, the present invention provides a polymer for use in a chemically amplified photoresist that is represented by the following chemical formula (CF1):

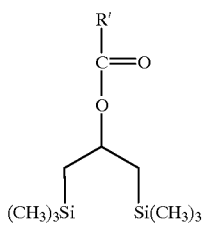

wherein R' is one selected from the group comprising:

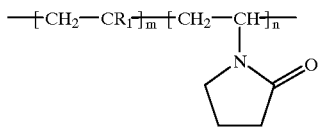

in which $R_1$ is one selected from the group comprising —H and —$CH_3$; m and n are integers; $m/(m+n)$= 0.1–0.6; and

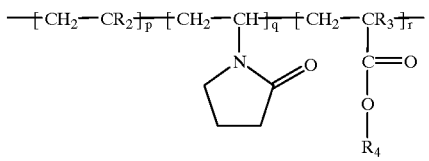

wherein $R_2$ is one selected from the group comprising —H and —$CH_3$; $R_3$ is one selected from the group comprising —H and —$CH_3$; $R_4$ is one selected from the group comprising —H; —$CH_3$ and —$CH_2CH_2OH$; p, q and r are integers; $p/(p+q+r)$= 0.1 to 0.7; $q/(p+q+r)$=0.1 to 0.7; and $r/(p+q+r)$=0.1 to 0.5.

A photoresist composition is provided in which the polymer represented by CF1 is combined with a photoacid generator (PAG). The polymer has a weight-average molecular weight of from 5,000 to 100,000. The photoresist composition comprises from 1 to 15 weight percent of the PAG based on the weight of the polymer. The PAG is selected from the group comprising triarylsulfonium salts, diaryliodonium salts, sulfonates and combinations thereof.

The photoresist composition further comprises an organic base which is present in an amount of from 0.01 to 2.0 weight percent of the polymer. The organic base is one selected from the group comprising triethyl amine, diethyl amine, triethanol amine, and any combination thereof.

The polymer has a silicon-containing acid-labile group, and therefore has a greater content of silicon than conventional polymers, while also providing excellent adhesion to other films.

The embodiments of the present invention will now be described in greater detail with reference to the following examples.

EXAMPLE 1

Synthesis of bis(trimethylsilyl)-2-propanol

The synthesis of bis(trimethylsilyl)-2-propanol is represented by the following reaction formula (RF1):

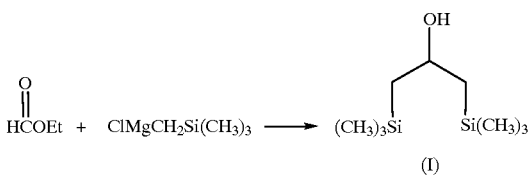

0.1 mol of ethyl formate was dropped slowly into a 0.3 molar solution of trimethylsilylmethyl magnesium chloride in diethyl ether. Then, the mixture was reacted for about 12 hours under reflux conditions.

After the reaction was complete, the reaction product was poured into an excess amount of water and neutralized using HCl. The resultant material was then extracted using diethyl ether and the extract was dried using $MgSO_4$.

The obtained product, bis(trimethylsilyl)-2-propanol, was separated and purified by vacuum distillation (yield 60%).

The results of nuclear magnetic resonance (NMR) analysis and Fourier transform infrared (FT-IR) performed on the distilled bis(trimethylsilyl)-2-propanol are as follows:

$^1$H-NMR (CDCl$_3$, ppm):
  0.0(18H, —CH$_3$), 0.9(4H, —CH$_2$—), 1.2(1H, —OH), 4.0(1H, —CH—)

FT-IR(NaCl, cm$^{-1}$):
  3300(—OH), 2950(C—H), 1400 and 1260(Si—C)

EXAMPLE 2

Synthesis of bis(trimethylsilyl) propyl methacrylate (BPMA)

The synthesis of a bis(trimethylsilyl) propyl methacrylate (BPMA) (II) monomer can be represented by the following reaction formula (RF2):

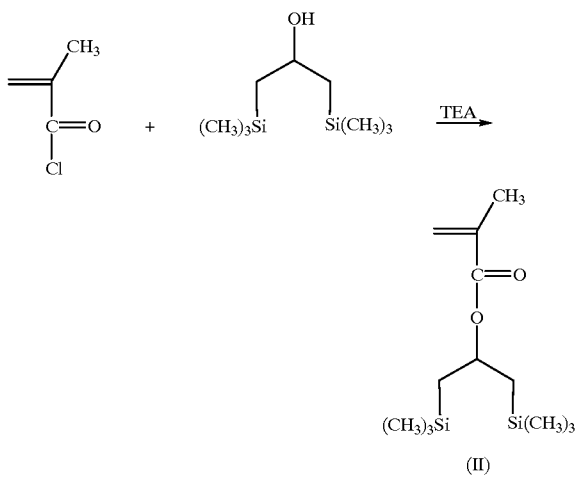

0.1 mol of bis(trimethylsilyl)-2-propanol (I) and 0.1 mol of triethylamine (TEA) were dissolved in methylene chloride, and 0.1 mol of methacryloyl chloride was slowly dropped into the mixture. The obtained mixture was then reacted for about 12 hours under reflux conditions.

After the reaction was complete, the reaction product was poured into an excess of water and neutralized using HCl. The resultant material was then extracted using diethyl ether and the extracts were dried using MgSO$_4$.

The obtained product was separated and purified by vacuum distillation to obtain BPMA (II) having an acid-labile 1,3-bis(trimethylsilyl) propyl group (yield 70%).

The results of nuclear magnetic resonance (NMR) analysis and Fourier transform infrared (FT-IR) performed on the distilled BPMA (II) are as follows:

$^1$H-NMR (CDCl$_3$, ppm):
   0.0(18H, Si—CH$_3$), 1.0(4H, —CH$_2$—), 1.9(3H, —CH$_3$), 5.2(1H, —CH—), 5.5 and 6.0(2H,=CH$_2$)

FT-IR(NaCl, cm$^{-1}$):
   2950(C—H), 1720(C=O), 1600 (C=C), 1400 and 1260(Si—C)

EXAMPLE 3
Synthesis of poly {bis (trimethylsilyl) propyl methacrylate-co-maleic anhydride}

The synthesis of a poly {bis (trimethylsilyl) propyl methacrylate-co-maleic anhydride} (III) can be represented by the following reaction formula (RF3):

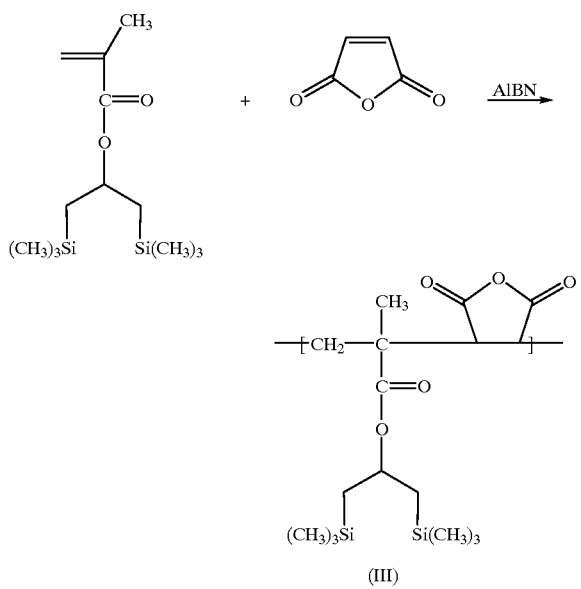

0.1 mol of BPMA (II) monomer synthesized in Example 2 and 0.1 mol of maleic anhydride were dissolved in an anhydrous tetrahydrofuran (THF) solution with 8 mmol of azobisisobutyronitrile (AIBN), and purged for about 2 hours using N$_2$ gas. Then, the reaction product was polymerized for about 24 hours under reflux conditions.

After the polymerization reaction was complete, the polymer product was precipitated slowly in excess n-hexane. The precipitate was then dissolved again in THF and reprecipitated in n-hexane.

The obtained product was dried in a vacuum oven maintained at about 50° C. for about 24 hours to obtain a poly {bis (trimethylsilyl) propyl methacrylate-co-maleic anhydride} (III) (yield 50%).

The weight-average molecular weight and polydispersity of the obtained product were 6,500 and 2.1, respectively.

EXAMPLE 4
Synthesis of poly {bis (trimethylsilyl) propyl methacrylate-co-N-vinyl pyrrolidinone}

The synthesis of a poly {bis (trimethylsilyl) propyl methacrylate-co-N-vinyl pyrrolidinone} (IV) can be represented by the following reaction formula (RF4):

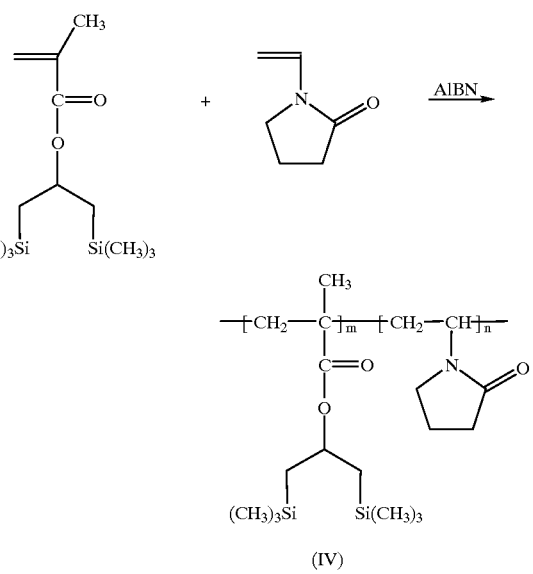

0.1 mol of BPMA (II) monomer synthesized in Example 2 and 0.1 mol of 1-vinyl-2-pyrrolidinone were dissolved in an anhydrous THF solution with 8 mmol of AIBN, and purged for about 2 hours using N$_2$ gas. Then, the reaction product was polymerized for about 24 hours under reflux conditions.

After the polymerization reaction was complete, the polymer product was precipitated slowly in excess n-hexane. The precipitate was then dissolved again in THF and reprecipitated in n-hexane.

The obtained product was dried in a vacuum oven maintained at about 50° C. for about 24 hours to obtain poly {bis (trimethylsilyl) propyl methacrylate-co-N-vinyl pyrrolidinone (IV)} (yield 75%).

The weight-average molecular weight and polydispersity of the poly {bis (trimethylsilyl) propyl methacrylate-co-N-vinyl pyrrolidinone (IV)} product were 13,500 and 2.2, respectively.

EXAMPLE 5

Synthesis of terpolymer

The synthesis of terpolymer (V) can be represented by the following reaction formula (RF5):

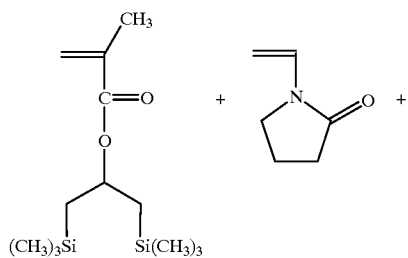

-continued

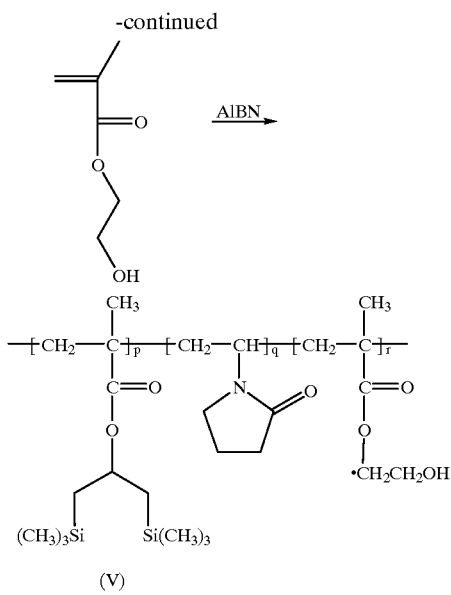

(V)

40 mmol of BPMA (II) monomer synthesized in Example 2, 30 mmol of 1-vinyl-2-pyrrolidinone, and 30 mmol of 2-hydroxyethyl methacrylate were dissolved in an anhydrous THF solution with 4 mmol of AIBN, and purged for about 2 hours using $N_2$ gas. Then, the reaction product was polymerized for about 24 hours under reflux conditions.

After the polymerization was complete, the polymer product was precipitated slowly in excess n-hexane. The precipitate was then dissolved again in THF and reprecipitated in n-hexane.

The obtained precipitate was dried in a vacuum oven for about 24 hours to obtain terpolymer (V)(yield 75%).

The weight-average molecular weight and polydispersity of the obtained terpolymer were 14,300 and 2.0, respectively.

EXAMPLE 6

Photolithographic Performance 1 g of copolymer synthesized in Example 3 and 0.03 g of the photoacid generator (PAG) triphenyl sulfonium triflate were completely dissolved in 7 g of propylene glycol monomethyl ether acetate (PGMEA). The resulting solution was filtered using a 0.2 µm filter to obtain a photoresist composition. Then, the photoresist composition was applied to a silicon wafer treated with hexamethyldisilazane (HMDS) to form a photoresist film having a thickness of about 0.3 µm on the wafer.

The wafer having the photoresist film coated thereon was then pre-baked at a temperature of about 100° C. for about 90 seconds and exposed to light using a KrF excimer laser having a numerical aperture of 0.45. Then, post-exposure baking (PEB) was performed at a temperature of about 110° C. for about 90 seconds.

The baked photoresist was developed using 2.38 wt % tetramethylammonium hydroxide (TMAH) solution. A clean 0.40 µm line and space pattern was obtained using an exposure dose of about 21 mJ/cm².

EXAMPLE 7

Photolithographic Performance 19 of the copolymer synthesized in Example 4 and 0.03 g of the photoacid generator triphenyl sulfonium triflate were completely dissolved in 7 g of PGMEA. Thereafter, the solution was filtered using a 0.2 µm filter to obtain a photoresist composition. The photoresist composition was then applied to a silicon wafer treated with HMDS to form a photoresist film hating a thickness of about 0.3 µm on the wafer.

The wafer coated with a film of photoresist was pre-baked at a temperature of about 100° C. for about 90 seconds, then exposed to light using a KrF excimer laser having a numerical aperture of 0.45. PEB was then performed at a temperature of about 110° C. for about 90 seconds.

The photoresist material was subsequently developed using 2.38 wt % of TMAH solution for about 60 seconds. A clean 0.40 µm line and space pattern was obtained when the exposure dose was about 25 mJ/cm².

The following reaction formula (RF6) represents the exposure reaction of the terpolymer by the KrF excimer laser provided by Example 7:

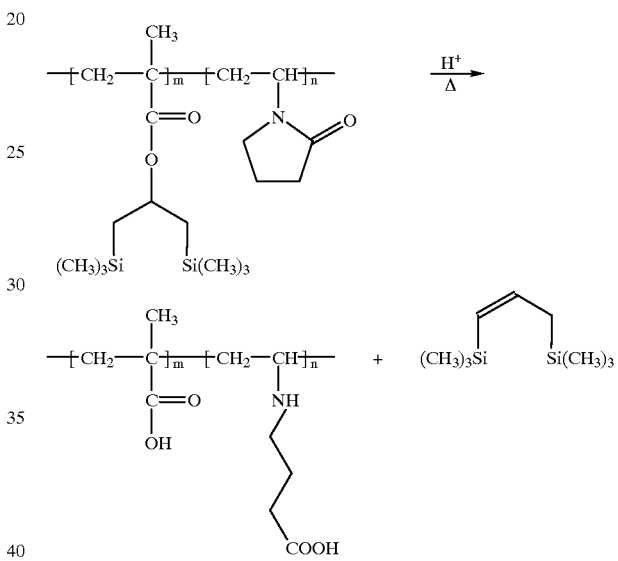

From the above reaction formula (RF6), it was found that the 1,3-bis(trimethylsilyl) propyl group was insoluble in a developing solution prior to exposure, but was highly soluble by active acid hydrolysis due to the acid that was generated by photosensitive acid generator during exposure to the KrF laser.

EXAMPLE 8

Photolithographic Performance 1 g of terpolymer synthesized in Example 5 and 0.03 g of triphenyl sulfonium triflate as a photoacid generator (PAG) were completely dissolved in 7 g of PGMEA. Thereafter, the solution was filtered using a 0.2 µm filter to obtain a photoresist composition. The photoresist composition was then applied to a silicon wafer treated with HMDS to form a photoresist film having a thickness of about 0.3 82 m on the wafer.

The wafer having the photoresist film coated thereon was pre-baked at a temperature of about 100° C. for about 90 seconds and exposed to light using a KrF excimer laser, having a numerical aperture of 0.45. Then, a post-exposure bake (PEB) was performed at a temperature of about 110° C. for about 90 seconds.

The resultant material was then developed using 2.38 wt % of TMAH solution for about 60 seconds. A clean 0.40 µm line and space pattern was obtained using an exposure dose of about 26 mJ/cm².

EXAMPLE 9

Photolithographic Performance 1 g of copolymer synthesized in Example 4 was completely dissolved in 7 g of PGMEA together with 0.01 g of triphenyl sulfonium triflate and 0.01 g of N-hydroxy succinimide triflate as PAGs. Subsequently, triethylamine (20 mol % of PAG) as an organic base was completely dissolved in the resultant material.

Thereafter, the solution was filtered using a 0.2 μm filter to obtain a photoresist composition. The photoresist composition was then applied to a silicon wafer treated with HMDS to form a photoresist film having a thickness of about 0.3 μm on the wafer.

The wafer having the photoresist film coated thereon was pre-baked at a temperature of about 100° C. for about 90 seconds, and then exposed to light using an ArF excimer laser having a numerical aperture of 0.60. A PEB wars then performed at a temperature of about 110° C. for about 90 seconds.

The baked photoresist material was developed using 2.38 wt % of TMAH solution for about 60 seconds. A clean 0.3 μm line and space pattern was obtained using an exposure dose of about 30 mJ/cm².

The polymer of the present invention having a silicon-containing acid-labile group, and the photoresist composition containing the polymer, are new materials to be used for a BLR.

The silicon-containing polymer according to the present invention has a higher silicon content and better adhesion to film materials than the conventional polymer. Therefore, the polymer can be used as a photoresist composition to obtain sharp patterns in manufacturing next-generation semiconductor devices.

Although preferred embodiments of the present invention have been described in detail hereinabove, many variations and/or modifications of the basic inventive concepts herein taught will appear to those skilled in the art. All such variations and/or modifications fall within the spirit and scope of the present invention as defined in the appended claims.

What is claimed is:

1. A photoresist composition comprising:

a polymer suitable for use in a chemically amplified photoresist comprising
a polymer backbone structure, and
a protecting group pendant from the polymer backbone structure, said protecting group being bis (trimethalsiylyl)-2-propyl ester group represented by the following formula:

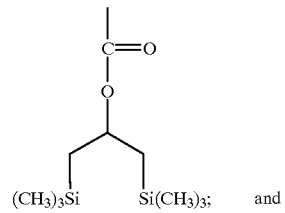

(CH₃)₃Si     Si(CH₃)₃;     and a photoacid generator (PAG).

2. The photoresist composition according to claim 1, comprising 1 to 15 weight percent of the PAG based on the weight of the polymer.

3. The photoresist composition according to claim 1, wherein the PAG is selected from the group comprising triarylsulfonium salts, diaryliodonium salts, sulfonates and combinations thereof.

4. The photoresist composition according to claim 3, wherein the PAG is one selected from the group comprising triphenyisulfonium triflates, N-hydroxy succinimide triflates and combinations thereof.

5. The photoresist composition according to claim 1, wherein the photoresist composition comprises 0.01–2.0 weight percent of the organic base based on the weight of the polymer.

6. The photoresist composition according to claim 1, wherein the organic base is one selected from the group comprising triethyl amine, diethyl amine, triethanol amine, and combinations thereof.

* * * * *